(12) United States Patent
Dreesen et al.

(10) Patent No.: US 8,385,140 B2
(45) Date of Patent: Feb. 26, 2013

(54) MEMORY ELEMENTS HAVING SHARED SELECTION SIGNALS

(75) Inventors: Michael Dreesen, Timnath, CO (US); Carson Henrion, Ft. Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 154 days.

(21) Appl. No.: 12/949,577

(22) Filed: Nov. 18, 2010

(65) Prior Publication Data

US 2012/0127805 A1    May 24, 2012

(51) Int. Cl.
 *G11C 7/22* (2006.01)
(52) U.S. Cl. .......... 365/189.14; 365/189.15; 365/189.16
(58) Field of Classification Search ............ 365/189.14, 365/189.15, 189.16
See application file for complete search history.

(56) References Cited

U.S. PATENT DOCUMENTS

| | | | |
|---|---|---|---|
| 5,612,913 A * | 3/1997 | Cappelletti et al. ...... | 365/185.12 |
| 6,034,921 A * | 3/2000 | Viot et al. ................ | 365/239 |
| 6,178,132 B1 * | 1/2001 | Chen et al. ............... | 365/230.02 |
| 6,628,563 B1 * | 9/2003 | Hsu et al. ................. | 365/230.03 |
| 7,409,473 B2 * | 8/2008 | Conley et al. ............. | 710/38 |
| 7,515,456 B2 * | 4/2009 | Mayer et al. .............. | 365/149 |
| 8,125,837 B2 * | 2/2012 | Yamaoka et al. .......... | 365/189.07 |

OTHER PUBLICATIONS

Wuu, J., et al. "The Asynchronous 24MB On-Chip Level-3 Cache for a Dual-Core Itanium-Family Processor," ISSCC, Session 26—Static Memory, Feb. 9, 2005. pp. 488-489, 618.
Dorsey, J., et al. "An Integrated Quad-Core Opteron Processor," ISSCC, Session 5—Microprocessors, Feb. 12, 2007. pp. 102-103.
Wang, Y., et al. "A 4.0 GHz 291Mb Voltage-Scalable SRAM Design in 32nm High-k Metal-Gate CMOS with Integrated Power Management," ISSCC, Session 27—SRAM and Emerging Memory, Feb. 11, 2009. pp. 456-458.

* cited by examiner

*Primary Examiner* — Pho M Luu
(74) *Attorney, Agent, or Firm* — Ingrassia Fisher & Lorenz, P.C.

(57) ABSTRACT

Apparatus are provided for memory elements and related computing modules. An exemplary memory element includes a first array of one or more memory cells, a second array of one or more memory cells, write selection circuitry associated with the first array, and read selection circuitry associated with the second array. The write selection circuitry and the read selection circuitry are configured to be activated concurrently.

19 Claims, 3 Drawing Sheets

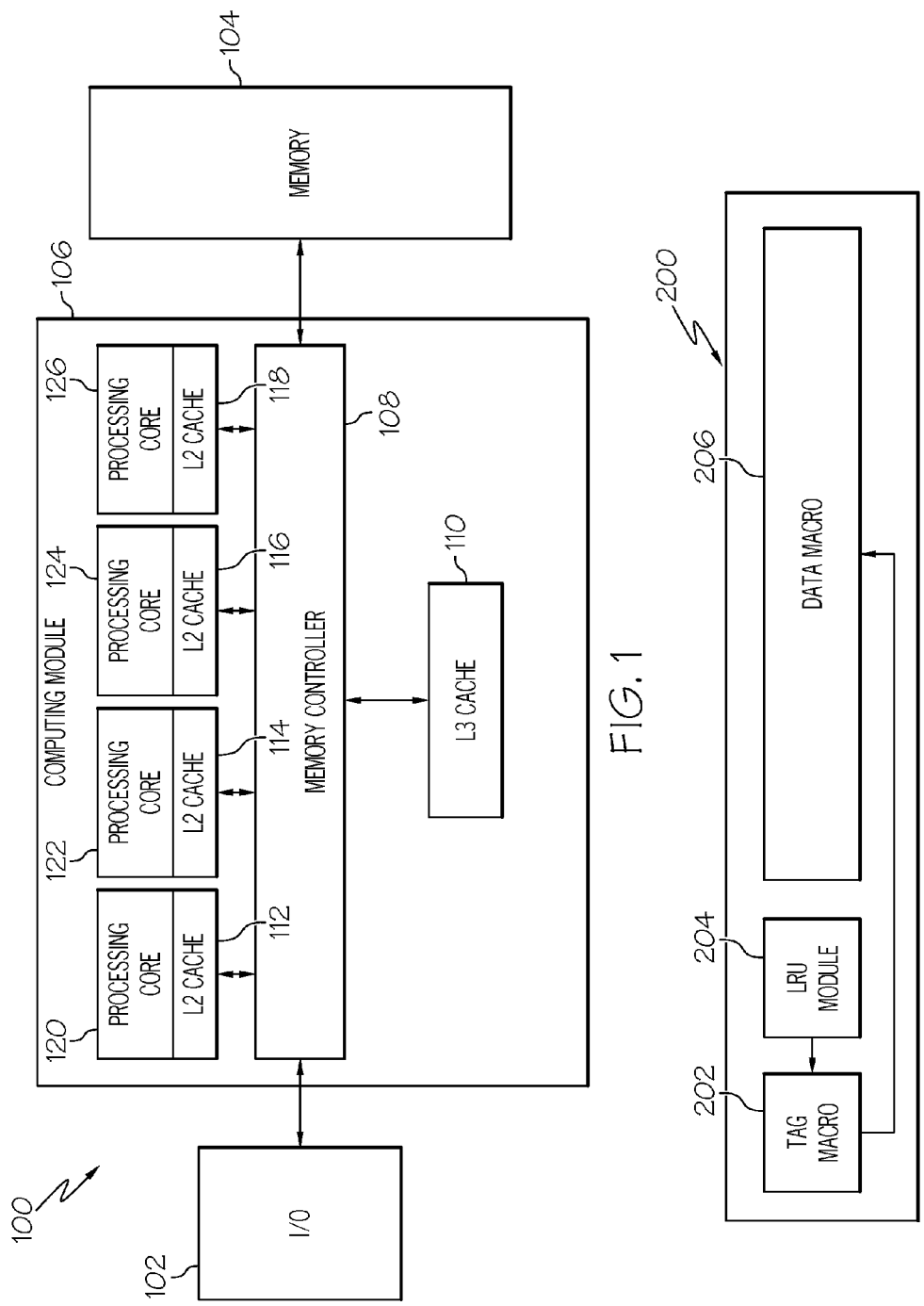

MEMORY ELEMENTS HAVING SHARED SELECTION SIGNALS

TECHNICAL FIELD

Embodiments of the subject matter described herein relate generally to electronic circuits, and more particularly, relate to memory elements for use in computing devices having selection signals shared by more than one memory cell.

BACKGROUND

Memory elements are widely used in computing applications. For example, a typical computing device may include a combination of volatile and non-volatile memory elements to maintain data, program instructions, and the like that are accessed by a processing unit (e.g., a CPU) during operation of the computing device. A typical cache memory element may include a myriad of individual memory cells. As the number of memory cells increases, the number of control signals needed to access memory cells or otherwise achieve desired functionality increases. Satisfying routing requirements (e.g., minimum spacing requirements per design rules for the technology) for these control signals often requires decreasing the density and/or increases the size of the memory element.

BRIEF SUMMARY

In general, an apparatus for a memory element is provided. The memory element includes a first array of one or more memory cells, a second array of one or more memory cells, write selection circuitry associated with the first array, and read selection circuitry associated with the second array. The write selection circuitry and the read selection circuitry are configured to be activated concurrently.

In one embodiment, an apparatus for an electronic device is provided. The electronic device includes a memory element and a control module coupled to the memory element. The memory element includes an array of memory cells having a plurality of columns, wherein a first column of the plurality of columns and a second column of the plurality of columns are configured to share a column select signal. The control module is configured to assert the column select signal to access a memory cell of the first column.

In another embodiment, a computer-readable medium has computer-executable instructions or data stored thereon that, when executed, facilitate fabrication of a memory element that includes write selection circuitry associated with a first array of one or more memory cells, and read selection circuitry associated with a second array of one or more memory cells. The write selection circuitry and the read selection circuitry are configured to be activated concurrently.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a block diagram of a computing system in accordance with one embodiment;

FIG. 2 is a block diagram of a cache memory element suitable for use in the system of FIG. 1 in accordance with one embodiment;

DETAILED DESCRIPTION

Figure 3:
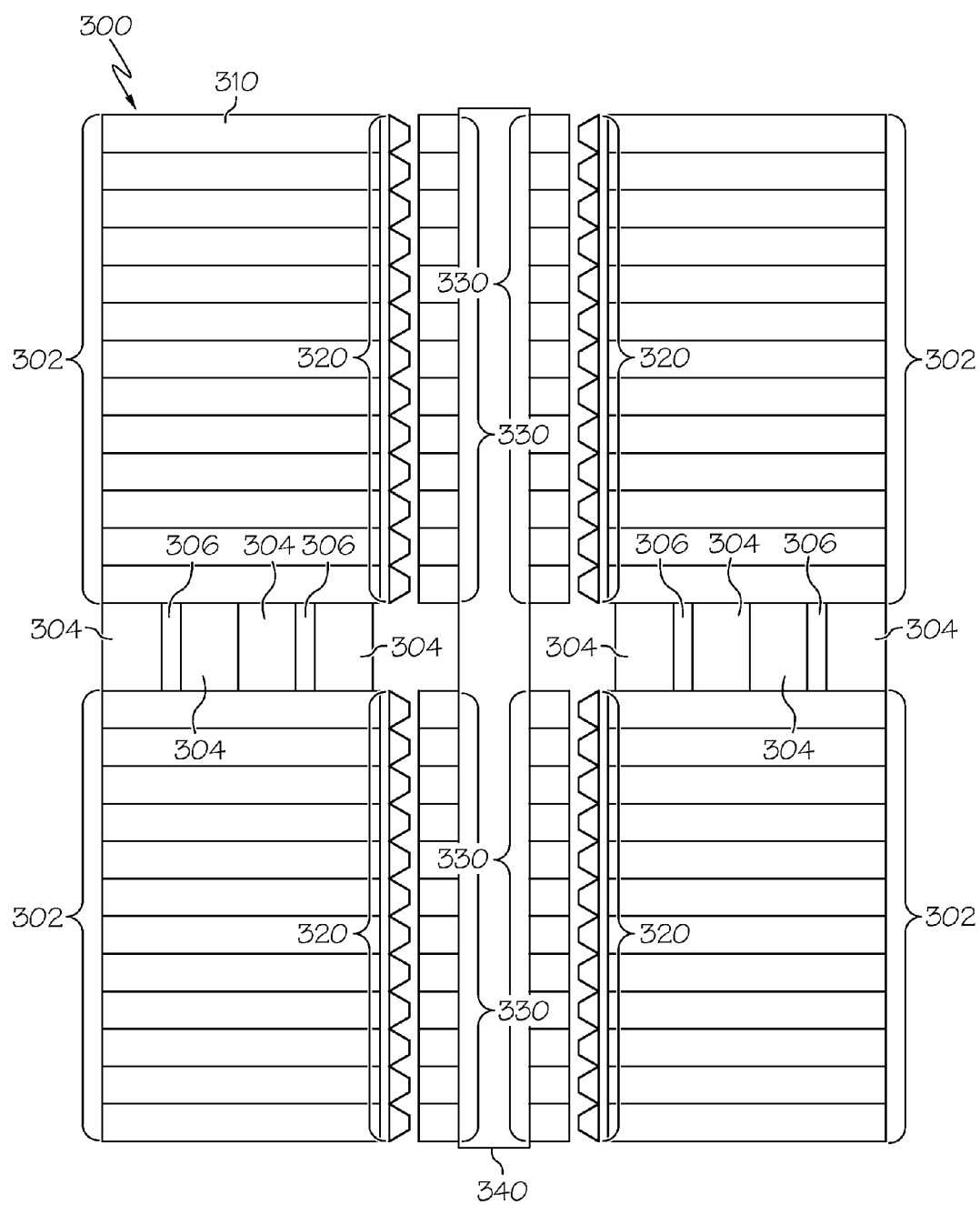
FIG. 3 is a block diagram of a way memory element suitable for use in the cache memory element of FIG. 2 in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to memory elements for use in computing modules having a reduced number of control signals. As described in greater detail below, in an exemplary embodiment, each column of memory cells inside an array of memory cells is aliased to another column of memory cells, such that the two aliased columns of memory cells share a common column select signal for accessing one of the aliased columns. In an exemplary embodiment, the shared column select signal is used to activate column selection circuitry used for writing data to a first column of the pair of aliased columns while concurrently activating column selection circuitry used for reading data from the other aliased column. In this manner, the number of column select signals is reduced, which, in turn, reduces the total amount of area required to route the column select signals, thereby increasing density and decreasing costs.

FIG. 1 depicts an exemplary embodiment of a computing system 100. The computing system 100 includes, without limitation, one or more input/output (I/O) peripherals 102, memory 104, and an electronic device 106, such as a computing module (e.g., a processor, central processing unit (CPU), graphics processing unit (GPU), or the like). In an exemplary embodiment, the computing module 106 includes a memory controller 108 (or northbridge) configured to interface with the I/O peripherals 102 and the memory 104, a plurality of cache memory elements (or caches) 110, 112, 114, 116, 118, and a plurality of processing cores 120, 122, 124, 126. It should be understood that FIG. 1 is a simplified representation of a computing system 100 for purposes of explanation and ease of description, and FIG. 1 is not intended to limit the subject matter in any way. Practical embodiments of the computing system 100 may include other devices and components for providing additional functions and features, and/or the computing system 100 may be part of a larger system, as will be understood.

The I/O peripherals 102 generally represent the hardware, software, and/or firmware components configured to support communications to/from the computing module 106 and one or more peripheral (or external) devices. For example, the I/O peripheral 102 may be realized as a bus or another communications interface configured to support data transmission to/from the computing module 106 in accordance with one or more data communication protocols.

The memory 104 generally represents the main memory or primary memory for the computing system 100. Depending on the embodiment, memory 104 may be realized as a hard disk, flash memory, ROM memory, RAM memory, another suitable storage medium known in the art or any suitable combination thereof. The memory 104 maintains data and/or program instructions to support operations of the computing system 100 and/or computing module 106 as will be appreciated in the art. In an exemplary embodiment, memory 104 is implemented separately from computing module 106 (e.g., on another chip and/or die), and accordingly, may be understood as being external to the computing module 106.

In an exemplary embodiment, the computing module 106 includes a memory controller 108 that is coupled to the I/O peripherals 102 and the external memory 104 and controls communications between the components of computing module 106 and the I/O peripherals 102 and/or external memory 104. The processing cores 120, 122, 124, 126 generally represent the main processing hardware, logic and/or circuitry for the computing module 106, and each processing core 120, 122, 124, 126 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 1, each processing core 120, 122, 124, 126 may implement its own associated cache memory element (e.g., a level one or L1 cache) in proximity to its respective processing circuitry for reduced latency. The caches 110, 112, 114, 116, 118 are realized as intermediary memory elements having reduced size relative to external memory 104 for temporarily storing data and/or instructions retrieved from external memory 104. In the illustrated embodiment, the computing module 106 includes a set of caches 112, 114, 116, 118 are in close proximity to and coupled between a respective processing core 120, 122, 124, 126 and the memory controller 108. In this regard, caches 112, 114, 116, 118 may be referred to as core-coupled caches, and each core-coupled cache 112, 114, 116, 118 maintains data and/or program instructions previously fetched from external memory 104 that were either previously used by and/or likely to be used by its associated processing core 120, 122, 124, 126. The caches 112, 114, 116, 118 are preferably larger than the L1 caches implemented by the processing cores 120, 122, 124, 126 and function as level two caches (or L2 caches) in the memory hierarchy. The illustrated embodiment of computing module 106 also includes another higher level cache 110 (a level three or L3 cache) that is preferably larger than the L2 caches 112, 114, 116, 118.

FIG. 2 depicts an exemplary embodiment of a cache memory element 200 suitable for use in the computing system 100 of FIG. 1. In an exemplary embodiment, the L3 cache 110 is realized as cache memory element 200. The illustrated embodiment of the cache memory element 200 includes a tag memory block (or tag macro) 202, a least recently used (LRU) module 204, and a data memory block (or data macro) 206. The data macro 206 generally represents the logical grouping of hardware and/or circuitry configured to maintain data and/or instructions previously requested or utilized by one or more of the processing cores 120, 122, 124, 126 that has been fetched from external memory 104 provided to the cache 200 (e.g., from L2 caches 112, 114, 116, 118 and/or external memory 104) by the memory controller 108. The tag macro 202 generally represents the logical grouping of hardware and/or circuitry configured to maintain tag information (e.g., a data identifier, status information, mapping information, indexing bits, error correction bits, and the like) associated with an individual portion or segment of data maintained by data macro 206. In an exemplary embodiment, the tag macro 202 includes a includes a plurality of way memory elements (or ways), wherein each way generally represents a subset of the tag macro 202 configured to store the status information and mapping information and perform additional tasks and functions, as described in greater detail below. In this regard, the cache memory element 200 comprises a set associative cache, wherein each way corresponds to a subset of the cache memory element 200 where tag information corresponding to an input address may be stored or otherwise located. The LRU module block 204 generally represents the logic, circuitry and/or other hardware configured to implement one or more algorithms to determine which entry (i.e., address or physical location) within the tag macro 202 is least recently (or least frequently) accessed. It should be appreciated that FIG. 2 is a simplified representation of a cache memory element for purposes of explanation and ease of description, and FIG. 2 is not intended to limit the subject matter in any way.

FIG. 3 depicts an exemplary embodiment of a way memory element (or way) 300 suitable for use in the tag macro 202 of FIG. 2. In an exemplary embodiment, a way 300 includes, without limitation, a plurality of arrays of memory cells 302, word line decoders (or word line decode logic) 304, and access controllers (or access control logic) 306. In an exemplary embodiment, the memory cells are realized as static random access memory (SRAM) cells. Accordingly, for convenience, but without limitation, the arrays of memory cells 302 may alternatively be referred to herein as arrays of SRAM cells or SRAM arrays. It should be understood that FIG. 3 is a simplified representation of a way 300 for purposes of explanation and ease of description, and FIG. 3 is not intended to limit the subject matter in any way. Practical embodiments of the way 300 may include other devices and components for providing additional functions and features, as will be understood.

Each array of SRAM cells 310 is configured to provide an individual bit of data from the way 300. As described in greater detail below in the context of FIG. 4, in an exemplary embodiment, each array of SRAM cells 310 is a two-dimensional rectangular array having a first number (n) of columns of cells by a second number (m) of rows of cells. For example, in an exemplary embodiment, each array of SRAM cells 310 is eight cells vertically (e.g., 8 columns) by thirty-two cells horizontally (e.g., 32 rows). Each array of SRAM cells 310 includes column select circuitry configured to select or otherwise enable access to (e.g., writing to and/or reading from) a particular column of cells within the respective array of SRAM cells 310 in response to signals from an associated access controller 306. In this regard, each access controller 306 is coupled one or more arrays of SRAM cells 310, and the access controllers 306 generally represent the circuitry, logic, and/or hardware components configured to select, activate, or otherwise enable the output of a particular column of cells within the respective arrays of SRAM cells 310. Each word line decoder 304 is coupled one or more arrays of SRAM cells 310, and the word line decoders 304 generally represent the circuitry, logic, and/or hardware components configured to select or otherwise enable access to (e.g., writing to and/or reading from) a particular row of cells within the arrays of SRAM cells 310. In this manner, to access (e.g., write data to or read data from) a particular SRAM cell of a first array of SRAM cells 310, its associated word line decoder 304 asserts or otherwise provides a word line select signal to enable access to the row of the array 310 containing the desired SRAM cell, and the access controller 306 associated with the array 310 asserts or otherwise provides a column select signal to enable access to the column of the array 310 including the desired SRAM cell.

In an exemplary embodiment, the way 300 includes a plurality of latching arrangements 330 corresponding to the total number of bits for an entry of the way 300. A plurality of multiplexers 320 are configured between the SRAM arrays 302 and the latching arrangements 330 to select or otherwise control which of the latching arrangements 330 the output of a respective SRAM array 310 is provided to. In an exemplary embodiment, the way 300 includes redundant SRAM arrays 310 (i.e., more SRAM arrays 310 than latching arrangements 330) to allow individual SRAM arrays 310 to be disabled or otherwise deselected by configuring the multiplexers 320 such that the output of a disabled SRAM array 310 is not provided to any of the latching arrangements 330. In this manner, an SRAM array 310 that is not validated during a test process may be disabled or otherwise repaired, as will be appreciated in the art. In the illustrated embodiment, the way 300 includes an output generation block 340 that generally represents the logic, circuitry, and/or hardware components configured to perform error correction and determine whether a particular entry in the way 300 (i.e., the outputs of the arrays of SRAM cells 302 provided to the latching arrangements 330) match or otherwise correspond to a desired item of data in the data macro 206 (i.e., a cache hit), as will be appreciated in the art.

Figure 4:
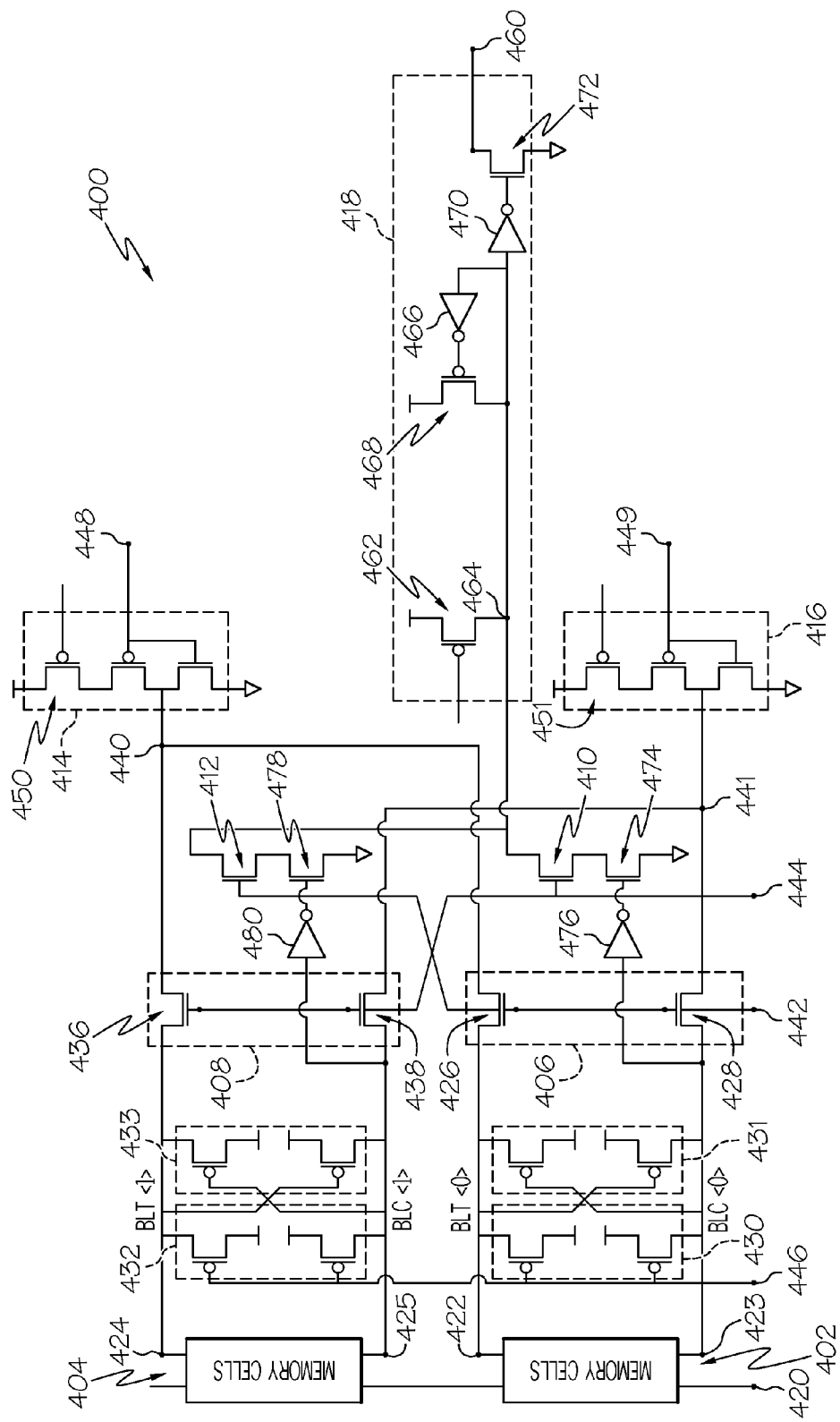
FIG. 4 is a schematic view of an array of memory elements suitable for use in the way memory element of FIG. 3 in accordance with one embodiment.

FIG. 4 depicts an exemplary embodiment of an array of memory cells 400 suitable for use as one array of memory cells (e.g., array 310) in the way 300 of FIG. 3. As set forth above, in an exemplary embodiment, the memory cells are realized as static random access memory (SRAM) cells, and accordingly, for convenience, the array of memory cells 400 may alternatively be referred to herein as an array of SRAM cells or an SRAM array. It should be understood that FIG. 4 is a simplified representation of an array of SRAM cells 400 for purposes of explanation and ease of description, and FIG. 4 is not intended to limit the subject matter in any way. In this regard, although FIG. 4 depicts an SRAM array 400 having only two columns of SRAM cells, practical embodiments of the SRAM array 400 will have more columns of SRAM cells (e.g., 8 columns as described above in the context of FIG. 3), and the subject matter is not intended to be limited to any particular number of columns of SRAM cells in an SRAM array. Furthermore, although the subject matter may be described herein in the context of an SRAM array inside a way of a tag macro, the subject matter is not intended to be limited to a particular implementation, and may be utilized with any array of memory cells or in any suitable memory element. Additionally, the subject matter is not intended to be limited to use with SRAM cells, and practical embodiments may utilize other suitable memory cells (e.g., dynamic random access memory (DRAM) cells) to perform the functions, tasks and/or operations described herein in an equivalent manner.

As described above, an array of SRAM cells 400 includes a plurality of columns of SRAM cells 402, 404, write column selection circuitry 406, 408 associated with each respective column of SRAM cells 402, 404, read column selection circuitry 410, 412 associated with each respective column of SRAM cells 402, 404, and access circuitry including write driver circuitry 414, 416 and sense amplifier circuitry 418. The write driver circuitry 414, 416 is configured to support writing input data bit values to the SRAM cells 402, 404 and the sense amplifier circuitry 418 configured to support reading output data bit values from the SRAM cells 402, 404, as described in greater detail below. It should be noted that although the subject matter may be described herein in the context of a full-swing sense amplifier implementation, the subject matter is not intended to be limited to any particular sensing scheme, and may be implemented in conjunction with small-signal sensing schemes or other suitable sensing schemes known in the art.

In FIG. 4, each column of SRAM cells 402, 404 represents a one dimensional array of SRAM cells having the number of SRAM cells corresponding to the number of rows in the SRAM array 400. For example, as described above in the context of FIG. 3, in one embodiment, each column of SRAM cells 402, 404 includes 32 SRAM cells corresponding to the number of rows of SRAM cells in the array 400. In this regard, a each column 402, 404 includes m number of SRAM cells that are selectable in response to word line signals at node 420 asserted by the word line decoder 304 associated with the SRAM array 400 as described above in the context of FIG. 3. Each SRAM cell of the first column 402 is coupled to a pair of bit line nodes 422, 423 that are associated with or otherwise correspond to the first column 402. The first bit line node 422 corresponds to a bit line true value (BLT<0>) being written to and/or read from an SRAM cell of the first column of SRAM cells 402 and the second bit line node 423 corresponds to a bit line complement value (BLC<0>) representing the logical inverse of the bit line true value. In a similar manner, each SRAM cell of the second column 404 is coupled to a pair of bit line nodes 424, 425 that are associated with or otherwise correspond to the second column 404, wherein bit line node 424 corresponds to a bit line true value (BLT<1>) being written to and/or read from an SRAM cell of the second column 404 and the second bit line node 423 corresponds to a bit line complement value (BLC<1>). In this regard, the first column of cells 402 and the second column of cells 404 are mutually exclusive, that is, a memory cell in the first column 402 (or a memory cell coupled to bit line nodes 422, 423) is not in the second column 404 (or coupled to bit line nodes 424, 425) and vice versa.

The write column selection circuitry 406, 408 generally represents the circuitry and/or logic configured to select, enable, or otherwise allow its associated column of SRAM cells 402, 404 to be written to by write driver circuitry 414, 416, as described in greater detail below. In an exemplary embodiment, the first write column selection circuitry 406 includes a first column select write transistor 426 configured between the output of the first write driver circuitry 414 at node 440 and bit line node 422 and a second column select write transistor 428 configured between the output of the second write driver circuitry 416 at node 441 and a second bit line node 423. In the illustrated embodiment, the column select write transistors 426, 428 are realized as n-type (or NMOS) transistors having their respective drain terminals connected to nodes 440, 441 and the source terminals connected to nodes 422, 423. The control (or gate) terminals of the column select write transistors 426, 428 are coupled to a node 442 configured to receive a first column select signal asserted by the access controller 306 associated with the SRAM array 400. As described in greater detail below, to write data to the first column of SRAM cells 402, the access controller 306 asserts or otherwise provides a logical high column select signal at node 442, and in response, the column select write transistors 426, 428 are turned on and conduct current to provide the respective voltages corresponding to the data values being written by write driver circuitry 414, 416 from nodes 440, 441 to nodes 422, 423, respectively. Similarly, the second write column selection circuitry 408 includes a column select write transistor 436 configured between the output of the first write driver circuitry 414 at node 440 and bit line node 424 and a column select write transistor 438 configured between the output of the second write driver circuitry 416 at node 441 and bit line node 425. The control (or gate) terminals of the column select write transistors 436, 438 are coupled to a node 444 configured to receive a second column select signal asserted by the access controller 306 associated with the SRAM array 400. In this regard, to write data to the second column of SRAM cells 404, the access controller 306 asserts or otherwise provides a logical high column select signal at node 444, and in response, the column select write transistors 436, 438 are turned on and conduct current to provide the respective voltages corresponding to the data values being written by write driver circuitry 414, 416 from nodes 440, 441 to nodes 424, 425, respectively.

In an exemplary embodiment, the columns of SRAM cells 402, 404 are aliased such that they share a column select signal. For example, in the illustrated embodiment, the first column select signal may be asserted at node 442 to either write data to the first column 402 or read data from the second column 404, or conversely, the second column select signal may be asserted at node 444 to either write data to the second column 404 or read data from the first column 402. In the illustrated embodiment, the read column selection circuitry 410 associated with the first column 402 is realized as an NMOS transistor 410 having its control terminal coupled to node 444 and its drain terminal coupled to a sense amplifier multiplexing input node 464. The source terminal of the NMOS transistor 410 is coupled to the drain terminal of a pull-down transistor 474, wherein the source terminal of the transistor 474 is coupled to a ground reference voltage potential. A control terminal of the transistor 474 is coupled to the output of an inverter 476 having its input coupled to bit line node 423. In this manner, to read data from the first column 402, the access controller 306 asserts or otherwise provides a logical high column select signal at node 444 to turn on the read transistor 410, which in turn, allows the transistor 474 to pull-down the voltage at the sense amplifier multiplexing input node 464 based on the stored data value (e.g., the voltage indicative of a stored data bit value) at bit line node 423. In this manner, a selected memory cell of the first column 402 (e.g., based on the word line select signals at node 420) influences the voltage at the sense amplifier multiplexing input node 464, and thereby influences the output data bit and/or voltage at the output node 460 while the column select signal at node 444 is asserted. However, as noted above, the logical high column select signal at node 444 will also result in the column select write transistors 436, 438 for the second column 404 being concurrently turned on or otherwise activated. In this regard, in response to a read instruction corresponding to a memory cell in the first column 402, the access controller 306 disables or otherwise tri-states the write driver circuitry 414, 416 (e.g., by providing signals to turn off transistors 450, 451) while asserting the logical high column select signal at node 444 to prevent writing data to the second column 404 while reading data from the addressed memory cell in the first column 402.

In a similar manner, the read column selection circuitry 412 associated with the second column 404 is realized as an NMOS transistor 412 having its control terminal coupled to node 442 and its drain terminal coupled to the sense amplifier multiplexing input node 464. The source terminal of the NMOS transistor 412 is coupled to the drain terminal of a pull-down transistor 478, wherein the source terminal of transistor 478 is coupled to a ground reference voltage potential and a control terminal of the transistor 478 is coupled to the output of an inverter 480 having its input coupled to bit line node 425. To read data from the second column 404, the access controller 306 asserts or otherwise provides a logical high column select signal at node 442 to turn on the read transistor 412, which in turn, allows the transistor 478 to pull-down the voltage at the sense amplifier multiplexing input node 464 based on the stored data value (e.g., the voltage indicative of a stored data bit value) at bit line node 425. However, as noted above, the logical high column select signal at node 442 will also result in the column select write transistors 426, 428 for the first column 402 being turned on. Thus, in response to a read instruction corresponding to a memory cell in the second column 404, the access controller 306 disables or otherwise tri-states the write driver circuitry 414, 416 while asserting a logical high column select signal at node 442 to prevent writing data to the first column 402 while reading data from the second column 404.

In the illustrated embodiment, the first write driver circuitry 414 is realized as a partial tri-state driver having its data input coupled to a first data bit input node 448 and its output coupled to the bit line true column select transistors 426, 436 at node 440. The first write driver circuitry 414 includes a transistor 450 configured to allow the access controller 306 to either enable the functionality of the write driver circuitry 414 when writing data or disable functionality of the write driver circuitry 414 when reading data, as set forth above. In this regard, in response to receiving a write instruction (e.g., from memory controller 108 and/or test control module 128), the access controller 306 associated with the SRAM array 400 provides a logical low read enable signal to the control terminal of transistor 450 to turn on transistor 450 and enable the write driver circuitry 414, thereby allowing the data bit value (or voltage) at the data bit input node 448 to influence the voltage at node 440. In a similar manner, the data input for the second write driver circuitry 416 is coupled to a second data bit input node 449, and the output of the second write driver circuitry 416 is coupled to the bit line complement column select transistors 428, 438 at node 441. The second write driver circuitry 416 also includes a transistor 451 configured to enable the functionality of the write driver circuitry 416 when writing data and disable functionality of the write driver circuitry 416 when reading data. In an exemplary embodiment, the test control module 128 and/or memory controller 108 provides voltages indicative of complementary data bit values to the data input nodes 448, 449 to write data to an SRAM cell of an SRAM array 310, 400, as described in greater detail below.

In the illustrated embodiment, the SRAM array 400 includes precharge circuitry 430, 432 and cross-coupling circuitry 431, 433 across each respective pair of bit line nodes 422, 423, 424, 425. During operation, the access controller 306 asserts or otherwise provides a logical low voltage signal to a node 446 coupled to the inputs of the precharge circuitry 430, 432 to restore the voltages of the bit line nodes 422, 423, 424, 425 to a logical high voltage value before and/or after each read or write operation performed by the SRAM array 400. The cross-coupling circuitry 431, 433 is configured to hold the voltage at one bit line node of each pair of bit line nodes 422, 423, 424, 425 to a logical high voltage value during a read or write operation to provide better stability, as will be appreciated in the art.

In an exemplary embodiment, the sense amplifier circuitry 418 is realized as a full-swing sense amplifier configured to provide an output voltage indicative of an output data bit value (e.g., a voltage indicative of a particular logic level) at output node 460 that is influenced by an input voltage at its input, that is, the input voltage at the sense amplifier multiplexing input node 464. The input voltage at the multiplexing input node 464 is indicative of or otherwise corresponds to a stored (or previously written) data bit value of an SRAM cell of the SRAM array 400 that is being read from, as described in greater detail below. In an exemplary embodiment, the sense amplifier circuitry 418 includes a precharge transistor 462 configured to precharge the sense amplifier multiplexing input node 464 of the sense amplifier circuitry 418 to a logical high voltage in response to a precharge signal from the access controller 306 at the control terminal of the transistor 462 before reading data from the SRAM array 400. The sense amplifier circuitry 418 also includes an inverter 466 coupled between the sense amplifier multiplexing input node 464 and a control terminal of a second transistor 468, such that the sense amplifier multiplexing input node 464 is maintained at its precharge value in the absence of the read column selection circuitry 410, 412 being selected, activated, or otherwise enabled. A second inverter 470 is coupled between the sense amplifier multiplexing input node 464 and the control (or gate) terminal of an output transistor 472 that controls the output voltage, and thereby, the output data bit value at output node 460. Thus, when a bit line complement value at a bit line complement node 423, 425 corresponds to a logical low voltage and its associated read transistor 410, 412 is turned on, the sense amplifier multiplexing input node 464 is pulled down to the logical low voltage value, which, in turn, turns on the output transistor 472 to produce a logical low voltage value at the output node 460 or otherwise discharge a precharged voltage at the output node 460, thereby indicating that the bit line complement value for the selected word line in the selected column is a logical '0' and the bit line true for the selected word line in the selected column is a logical '1'. Conversely, when a bit line complement value at a bit line complement node 423, 425 corresponds to a logical high voltage and its associated read transistor 410, 412 is turned on, the sense amplifier multiplexing input node 464 is held to the logical high voltage value by the inverter 466 and transistor 468, which, in turn, maintains the output transistor 472 in a turned off state to maintain the precharged voltage at the output node 460, thereby indicating that the bit line complement value for the selected word line in the selected column is a logical '1' and the bit line true for the selected word line in the selected column is a logical '0'.

To write data to the first column 402 of the SRAM array 400, the memory controller 108 provides complementary data bits (or voltages indicative thereof) to the data input nodes 448, 449, and provides, to the appropriate word line decoder 304 and access controller 306, a write instruction along with corresponding addressing information indicating the SRAM cell that the data bits are intended to be written. In response, the access controller 306 asserts or otherwise provides a logical low read enable signal to the control terminals of transistors 450, 451 to enable the functionality of the write driver circuitry 414, 416 and asserts or otherwise provides a logical high column select signal at node 442 to turn on or otherwise enable transistors 426, 428 and provide the voltages at nodes 440, 441 to the bit line nodes 422, 423 for the first column 402. While the column select signal at node 442 is asserted, the read column select transistor 412 for the second column 404 is concurrently activated or turned on, resulting in the data stored by the memory cell in the selected row of the second column 404 influencing the output node 460 of the sense amplifier circuitry 418 (e.g., a dummy read).

Conversely, to read data from the first column 402 of the SRAM array 400, the memory controller 108 provides, to the appropriate word line decoder 304 and access controller 306, a read instruction along with corresponding addressing information indicating the SRAM cell intended to be read from. In response, the access controller 306 asserts or otherwise provides a logical high read enable signal to the control terminals of transistors 450, 451 to disable the functionality of the write driver circuitry 414, 416 and asserts or otherwise provides a logical high column select signal at node 444 to turn on or otherwise enable read column select transistor 410 and allow the selected memory cell in the first column 402 to control operation of transistor 474, and thereby influence the voltage at the sense amplifier multiplexing input node 464 and/or the output data (or voltage) at the output node 460. While the column select signal at node 444 is asserted, the write column select transistors 436, 438 for the second column 404 are concurrently activated or turned on, however, by disabling or otherwise tri-stating the write driver circuitry 414, 416, the data stored by the memory cell in the selected row of the second column 404 is not influenced by the operation of the write column select transistors 436, 438.

It should be appreciated that although FIG. 4 depicts only two columns, practical embodiments of the SRAM array 400 will have more columns of SRAM cells (e.g., 8 columns as described above in the context of FIG. 3), and in some embodiments, the columns of memory cells may not be aliased in a corresponding manner. For example, a first column select signal may be shared and configured to activate write column selection circuitry for a first column of memory cells and read column selection circuitry for a second column of memory cells. A second column select signal may be shared and configured to activate the write column selection circuitry for the second column and the read column selection circuitry for a third column of memory cells, while a third column select signal may be shared and configured to activate the write column selection circuitry for the third column and the read column selection circuitry for the first column of memory cells. Accordingly, it should be appreciated that there are numerous possible permutations and/or combinations for configuring column select signals among columns of memory cells. In this regard, the manner in which column select signals are shared between columns may be chosen to satisfy a desired performance requirement (e.g., to maximize density, minimize parasitics, etc.).

To briefly summarize, one advantage of the memory elements described above is that the number of column select signals needed to operate and/or access an array of memory cells is reduced, thereby reducing the area requirements for routing the column select signals and/or improving density without compromising the read and/or write functionality for the array of memory cells.

For the sake of brevity, conventional techniques related to integrated circuit design, caching, memory operations, memory controllers, and other functional aspects of the systems (and the individual operating components of the systems) may not be described in detail herein. Physical embodiments of the subject matter described herein can be realized using existing semiconductor fabrication techniques and computer-implemented design tools. For example, hardware description language code, netlists, or the like may be utilized to generate layout data files, such as Graphic Database System data files (e.g., GDSII files), associated with various logic gates, standard cells and/or other circuitry suitable for performing the tasks, functions, or operations described herein. Such layout data files can be used to generate layout designs for the masks utilized by a fabrication facility, such as a foundry or semiconductor fabrication plant (or fab), to actually manufacture the devices, apparatus, and systems described above (e.g., by forming, placing and routing between the logic gates, standard cells and/or other circuitry configured to perform the tasks, functions, or operations described herein). In practice, the layout data files used in this context can be stored on, encoded on, or otherwise embodied by any suitable non-transitory computer-readable medium as computer-executable instructions or data stored thereon that, when executed by a computer, processor, of the like, facilitate design or fabrication of the apparatus, systems, devices and/or circuitry described herein.

The connecting lines shown in the various figures contained herein are intended to represent exemplary functional relationships and/or physical couplings between the various elements. It should be noted that many alternative or additional functional relationships or physical connections may be present in an embodiment of the subject matter. In this regard, although the figures may depict direct electrical connections between circuit elements and/or components, alternative embodiments may employ intervening circuit elements and/or components while functioning in a substantially similar manner. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A memory element comprising:
a first array of one or more memory cells;
a second array of one or more memory cells;
a first write transistor associated with the first array; and
a first read transistor associated with the second array, wherein the first write transistor and the first read transistor are configured to be activated concurrently.

2. The memory element of claim 1, further comprising:
a second write transistor associated with the second array; and
a second read transistor associated with the first array, wherein the second write transistor and the second read transistor are configured to be activated concurrently.

3. The memory element of claim 2, wherein:
a control terminal of the first read transistor is coupled to a control terminal of the first write transistor; and
a control terminal of the second read transistor is coupled to a control terminal of the second write transistor.

4. The memory element of claim 2, further comprising a control module configured to:
assert a first signal to write data to a first memory cell in the first array, the first read transistor and the first write transistor being activated while the first signal is asserted; and
assert a second signal to write data to a second memory cell in the second array, the second read transistor and the second write transistor being activated while the second signal is asserted.

5. The memory element of claim 2, further comprising a control module configured to:
assert a first signal to read data from a first memory cell in the second array, the first read transistor and the first write transistor being activated concurrently when the first signal is asserted; and
assert a second signal to read data from a second memory cell in the first array, the second read transistor and the second write transistor being activated concurrently while the second signal is asserted.

6. The memory element of claim 5, further comprising write driver circuitry configured to write data to the first array when the first write transistor is activated and write data to the second array when the second write transistor is activated, wherein the control module is configured to:
disable the write driver circuitry while asserting the first signal to read data from the first memory cell in the second array; and
disable the write driver circuitry while asserting the second signal to read data from the second memory cell in the first array.

7. A memory element comprising:
a first array of one or more memory cells;
a second array of one or more memory cells;
first write selection circuitry associated with the first array;
first read selection circuitry associated with the second array;
write driver circuitry configured to write data to the first array when the first write selection circuitry is activated; and
a control module configured to assert a first column select signal and disable the write driver circuitry while asserting the first column select signal to read data from a first memory cell of the second array, wherein the first read selection circuitry and the first write selection circuitry are configured to be activated concurrently when the first column select signal is asserted.

8. The memory element of claim 7, further comprising sense amplifier circuitry coupled to the first read selection circuitry, wherein the sense amplifier circuitry is configured to generate output data influenced by the first memory cell when the first read selection circuitry is activated.

9. The memory element of claim 8, further comprising:
second write selection circuitry associated with the second array, the write driver circuitry being configured to write data to the second array when the second write selection circuitry is activated; and
second read selection circuitry associated with the first array, the sense amplifier circuitry being coupled to the second read selection circuitry and configured to generate output data influenced by a second memory cell of the first array when the second read selection circuitry is activated, wherein the control module is configured to:
- assert a second column select signal to read data from the second memory cell, the second read selection circuitry and the second write selection circuitry being activated concurrently while the second column select signal is asserted; and
- disable the write driver circuitry while asserting the second column select signal to read from the second memory cell.

10. A memory element comprising:
- a first array of one or more memory cells;
- a second array of one or more memory cells;
- first write selection circuitry associated with the first array;
- first read selection circuitry associated with the second array, wherein the first write selection circuitry and the first read selection circuitry are configured to be activated concurrently;
- a third array of one or more memory cells;
- second write selection circuitry associated with the third array; and
- second read selection circuitry associated with the first array, wherein the second write selection circuitry and the second read selection circuitry are configured to be activated concurrently.

11. An electronic device comprising a memory element including an array of memory cells having a plurality of columns, wherein a first column of the plurality of columns and a second column of the plurality of columns are configured to share a first column select signal, wherein the first column select signal is configured to concurrently activate write column selection circuitry associated with the first column and read column selection circuitry associated with the second column to write to a memory cell of the first column.

12. The electronic device of claim 11, wherein the memory element further comprises write driver circuitry configured to write data to the memory cell of the first column when the write column selection circuitry is activated.

13. The electronic device of claim 11, further comprising a control module coupled to the memory element to assert the first column select signal to access a memory cell of the first column.

14. An electronic device comprising a memory element including an array of memory cells having a plurality of columns, wherein a first column of the plurality of columns and a second column of the plurality of columns are configured to share a first column select signal, wherein the first column select signal is configured to concurrently activate write column selection circuitry associated with the second column and read column selection circuitry associated with the first column to read from a memory cell of the first column.

15. The electronic device of claim 14, further comprising a control module coupled to the memory element to assert the first column select signal to access a memory cell of the first column, wherein:
- the memory element further comprises write driver circuitry configured to write data to the second column when the write column selection circuitry is activated; and
- the control module and the memory element are cooperatively configured to disable the write driver circuitry while asserting the first column select signal to read from the memory cell of the first column.

16. The electronic device of claim 14, wherein the memory element further comprises sense amplifier circuitry configured to generate output data that is influenced by the memory cell of the first column when the read column selection circuitry is activated.

17. The electronic device of claim 14, further comprising a control module coupled to the memory element to assert the first column select signal to access a memory cell of the first column.

18. A computer-readable medium having computer-executable instructions or data stored thereon that, when executed, facilitate design or fabrication of a memory element comprising:
- write selection circuitry associated with a first array of one or more memory cells, the write selection circuitry comprising a write transistor coupled to the first array and write driver circuitry; and
- read selection circuitry associated with a second array of one or more memory cells, the read selection circuitry comprising a read transistor coupled to the second array and sense amplifier circuitry, a control terminal of the write transistor being coupled to a control terminal of the read transistor, wherein the write selection circuitry and the read selection circuitry are configured to be activated concurrently.

19. The computer-readable medium of claim 18, wherein: the computer-executable instructions or data represent layout designs for masks utilized to fabricate the write transistor and the read transistor.

* * * * *